(12) United States Patent
Wilson

(10) Patent No.: US 6,178,019 B1
(45) Date of Patent: Jan. 23, 2001

(54) SYSTEM AND METHOD FOR CONTROLLING THE SELECTIVITY OF A HOLOGRAPHIC MEMORY SYSTEM

(75) Inventor: William Larry Wilson, Somerville, NJ (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/304,031

(22) Filed: May 3, 1999

(51) Int. Cl.[7] .............................. G03H 1/10; G03H 1/12; G03H 1/20; G11C 13/04
(52) U.S. Cl. ................... 359/10; 359/11; 359/12; 359/22; 365/125
(58) Field of Search .................... 359/10, 11, 12, 359/22, 32, 30; 365/125

(56) References Cited

U.S. PATENT DOCUMENTS

| 4,960,311 | * | 10/1990 | Moss et al. | 359/12 |
| 6,018,402 | * | 1/2000 | Campbell et al. | 359/22 |

* cited by examiner

Primary Examiner—Audrey Chang
(74) Attorney, Agent, or Firm—Stroock & Stroock & Lavan LLP

(57) ABSTRACT

A system and method for controlling the selectivity function in a holographic memory system that permits more rapid location and retrieval of holographically stored data. The system and method direct a reference beam through a filter such as, for example, an aperture, to bandwidth limit the beam before the beam illuminates a holographic optical element having stored therein a hologram of a reference beam.

19 Claims, 4 Drawing Sheets

SYSTEM AND METHOD FOR CONTROLLING THE SELECTIVITY OF A HOLOGRAPHIC MEMORY SYSTEM

FIELD OF THE INVENTION

The invention relates to holographic memory systems and, more particularly, to a system and method for controlling the selectivity of a holographic memory system.

BACKGROUND OF INVENTION

Holographic memory or storage systems involve the three-dimensional storage of holographic representations of data elements (i.e., holograms) as a pattern of varying refractive index and/or absorption imprinted in the volume of a storage medium such as a crystal of lithium niobate. Holographic memory systems (HMS) are characterized by their high density storage potential and the potential speed with which the stored data is randomly accessed and transferred.

In general, holographic memory systems operate by combining a data encoded object beam with a phase coherent reference beam to create an interference pattern throughout a photosensitive storage medium such as a holographic memory cell (HMC). The interference pattern induces material alterations in the HMC that record a hologram. The response of the hologram in the storage medium is a function of the relative amplitudes and polarization states of, and phase differences between, the object beam and the reference beam. It is also highly dependent on the incident beam's wavelengths and angles at which the object beam and the reference beam are projected into the storage medium.

Holographically stored data is reconstructed by projecting a reference beam similar to the reference beam used in storing the data into the HMC at the same angle, wavelength, phase and position used to produce the hologram. The hologram and the reference beam interact to reconstruct the stored object beam (i.e., the data). The reconstructed object beam may then be detected, e.g., using a photodetector array. The recovered data may then be post-processed for delivery to output devices.

Typically, the dynamic range of the holographic storage medium is larger than what is needed to store a single hologram with an acceptable signal-to-noise ratio. Therefore, it is desirable to multiplex a number of holograms at one location in the storage medium to achieve greater storage density. One multiplexing technique is phase correlation multiplexing (PCM), in which correlation selectivity and Bragg selectivity are used for differentiating overlapping holograms within a storage medium. Correlation selectivity relies on the differences in amplitude, phase and angle content of the reference beam produced by the relative shift (in any direction) of the storage medium with respect to its reference beam.

However, multiplexing schemes such as PCM require relatively complex reference beams whose formation involve complicated phase masks, high quality lenses, and Fourier plane spatial filtering. Unfortunately, the phase masks are delicate in structure, the lenses are expensive and bulky, and the necessary Fourier plane spatial filters block much of the incoming optical energy, greatly increasing the system's power budget. Also, for PCM holographic memory systems, the alignment of these elements is critical down to the micron ($\mu$m) level and typically needs to be consistent from system to system. The level of such consistency is often difficult if not impossible to achieve using conventional components and techniques. A holographic optical element (HOE) can be used to generate or reconstruct a reference beam for the holographic memory system. The HOE thus provides a relatively inexpensive, simple and reproducibly consistent replacement for one or more of the optical elements typically required to reproduce a reference beam in a HMS. An exemplary HOE is disclosed in application Ser. No. 08/968,024, the entire disclosure of which is incorporated herein by reference.

When using PCM or other correlation selectivity techniques within holographic storage systems, the resulting information stored in the HMC is characterized by relatively high resolution and thus high selectivity. While high resolution and high selectivity are desirable, and even necessary, for high-density recording of holograms in the HMC, retrieving restored holographic data also requires high resolution and high selectivity techniques and devices.

Therefore, it is desirable to increase the width of the selectivity function of the stored hologram to thereby provide the ability to search for and retrieve stored holographic data more quickly.

SUMMARY OF THE INVENTION

The present invention provides a system and method for controlling the selectivity function in a holographic memory system that permits more rapid location and retrieval of holographically stored data. In accordance with the present invention, a reference beam is directed through a filter such as, for example, an aperture, to bandwidth limit the beam before the beam illuminates a holographic optical element having stored therein a hologram of a reference beam.

The present invention provides a system for controlling the selectivity in a holographic memory system (HMS) that includes a holographic memory cell (HMC) for the location and retreival of holographically stored data having holographic data stored therein. The PCM holographic memory system also includes a holographic optical element (HOE) having stored therein a hologram of a HMS reference beam having a predetermined frequency spectrum. An object beam source is provided for generating an object beam and for directing the object beam toward the holographic memory cell. A plane wave source is also provided for generating a plane wave signal and for directing the plane wave signal toward the HOE. The system also includes a filter, located between the plane wave source and the HOE, for manipulating the plane wave optical field. Upon illumination of the HOE by the manipulated plane wave signal, the HOE projects a modified HMS reference beam toward the holographic memory cell.

The present invention is also directed to a method of controlling the selectivity of a holographic memory system (HMS) including a holographic memory cell (HMC) having holographic data stored therein. The HMS also includes a holographic optical element (HOE) having a hologram of a HMS reference beam stored therein, an object beam source for generating an object beam and for directing the object beam toward the holographic memory cell, and a plane wave source for generating a plane wave signal and for directing the plane wave signal toward the HOE. The method comprises the step of manipulating the plane wave signal so that the HOE projects a modified HMS reference beam toward the holographic memory cell upon illumination of the HOE by the manipulated plane wave signal.

The present invention is further directed to a method of locating a holographic data stored in a holographic storage material having a plurality of holographic data stored therein"

and used in a holographic memory system (HMS) including a holographic optical element (HOE) having stored therein a hologram of a HMS reference beam. The method of this embodiment comprises directing an object beam toward the holographic storage material. The method further comprises manipulating a plane wave signal directed toward the HOE so that, upon illumination of the HOE by the manipulated plane wave signal, the HOE projects a modified HMS reference beam toward the holographic storage material.

The present invention is also directed to a system for locating and retrieving holographic data stored in a holographic storage material. The system of this embodiment includes a holographic optical element (HOE) having stored therein a hologram of reference beam. The system further includes a light source for generating a generally collimated light signal and for directing the light signal toward the HOE. The system also includes a filter, located between the light source and the HOE, for manipulating the light signal. Upon illumination of the HOE by the manipulated light signal, the HOE projects a modified reference beam toward the holographic storage material.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

One technique for multiplexing a number of holograms to achieve greater storage density in a holographic storage material is phase correlation multiplexing (PCM). Phase correlation multiplexing is disclosed in U.S. Pat. No. 5,719,691, the entire disclosure of which is incorporated herein by reference.

As used herein, the term "holographic medium" and "holographic storage material" refer to the actinic material within which a hologram may be recorded. It may take a variety of forms, such as, for example, a film containing dispersed silver halide particles, an acrylate-based photopolymer, or a free-standing $LiNbO_3$ crystal.

As used herein, the term "holographic optical element" (HOE) refers to a defractive optic that may represent one or a plurality of holograms of a reference beam used in the holographic memory system (HMS). A HOE is created, generated, formed, etc. by the interference in the holographic material between a plane wave signal (i.e., a HOE reference beam) and an object beam (i.e., a HMS reference beam). The HOE can be constructed of any material suitable for recording a hologram. Once an HOE is created, the HMS reference beam may be reconstructed by directing a plane wave (i.e., generally collimated light signal) having the same characteristics as the HOE reference beam upon the HOE. The reconstructed reference beam thus provides a means for generating the HMS reference beam without requiring an optical processor. Thus, the HOE provides a single optical element for generating a reference beam that replaces the optical processor, and simplifies how a reference beam is created in a holographic memory system.

As used herein, the term "selectivity" and "selectivity function" refer to the ability of a holographic memory system (or other system for recording and/or retrieving holographic information) to differentiate between a plurality of holographic information stored in a holographic storage material. The selectivity of a holographic memory system may depend, at least in part, on the bandwidth of a reference signal used to record and retrieve holographic information.

Figure 1:
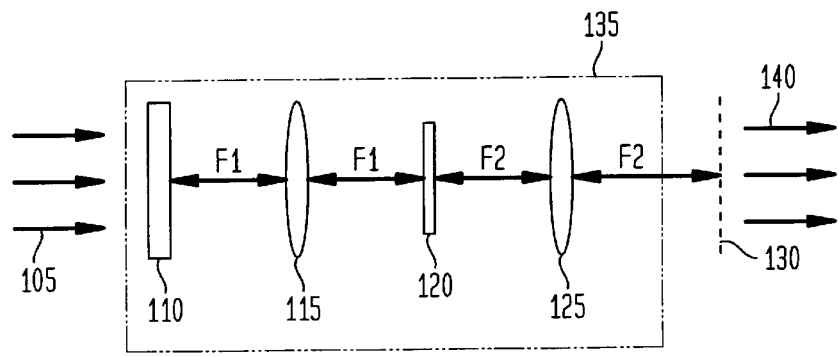
FIG. 1 is a schematic diagram of an optical processor for transforming a plane wave signal into an encoded object signal.

Referring now to FIG. 1, a typical optical processor 135 for use in a phase correlation multiplexing (PCM) holographic memory system (HMS) is shown. The optical processor 135 converts a plane wave signal 105 to an encoded beam that may be used as a reference beam for the HMS (i.e., an HMS reference beam). More specifically, a plane wave signal 105 (i.e., coherent beam of laser light) illuminates a highly structured reference mask 110 (e.g., a phase mask and/or an amplitude mask) that encodes light beam 105, e.g., by inducing a high space bandwidth product on the plane wave signal. The encoded beam propagates a distance f1 to a first lens 115, which has a focal length f1. Passing through first lens 115 produces the Fourier transform of reference phase mask 110 at another distance f1 beyond first lens 115. A high-pass spatial filter 120 is provided at the plane of the Fourier transform. Filter 120 typically blocks much of the lower spatial frequencies emanating from reference mask 110. After passing through high-pass filter 120, the encoded beam propagates a distanced f2 to a second lens 125, which has a focal length f2. The encoded beam passes through second lens 125 and propagates another distance f2 to reach its image plane 130. At the image plane 130, the encoded beam 140 may be characterized as a reference beam for the holographic memory system (HMS), i.e., a HMS reference beam.

Figure 2:
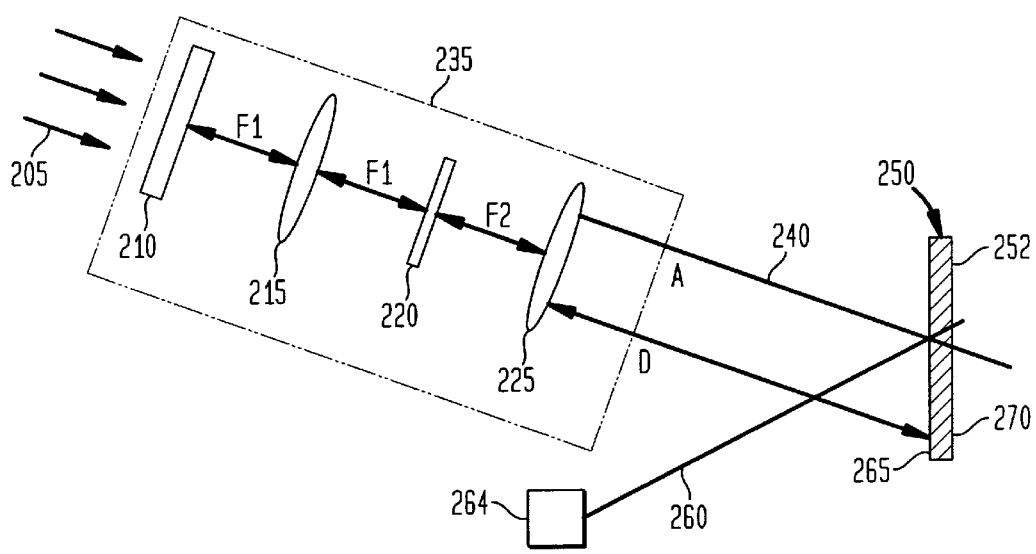
FIG. 2 is a schematic diagram of the generation of a transmission-mode holographic optical element for a phase correlation multiplexing holographic memory system.
Figure 3:
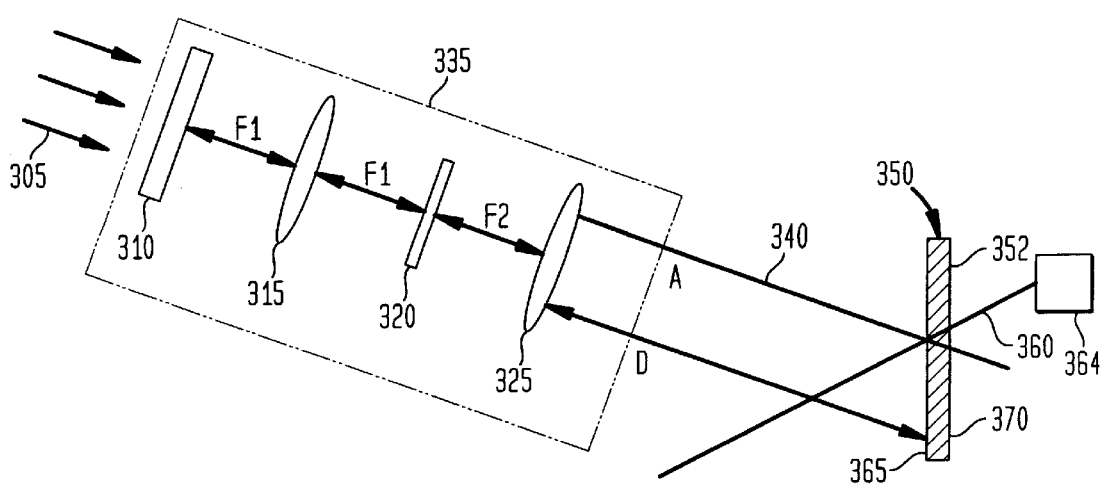
FIG. 3 is a schematic diagram of the generation of a reflection-mode holographic optical element for a phase correlation multiplexing holographic memory system.

By locating a holographic medium at image plane 130, a hologram of the encoded beam 140 (i.e., a hologram of the HMS reference beam) can be stored in the holographic medium (see, e.g., FIGS. 2 and 3).

The terms "reference beam" and "object beam" are used herein to refer to the beams used in generating a HOE, and to the beams used in the holographic memory system. As such, the different uses of these terms herein will be distinguished by using "HOE" and "HMS", as appropriate.

Referring now to FIG. 2, the generation or formation of a holographic optical element (HOE) 250 for use in a holographic memory system in accordance with the present invention is there depicted. In particular, FIG. 2 depicts the generation of a transmission-mode HOE 250. The HOE object beam 240 (labeled A), which is also the HMS reference beam, is generated as described above with respect to FIG. 1. The HOE object beam 240 propagates or is otherwise directed from the optical processor 235 a distance D toward a holographic storage material 252. The HOE object beam 240 impinges upon the holographic storage material 252, where it intersects with a HOE reference beam 260 (a plane wave signal), which is coherent with the HOE object beam 240. The HOE reference beam 260 is generated by a source 264 and is directed therefrom toward the holographic storage material 252 to illuminate the holographic storage material 252 and intersect with the HOE object beam 240 at a predetermined location within the material 252. The resulting interference pattern between the HOE object beam 240 and HOE reference beam 260 is captured as a hologram within the holographic storage material 252, thus transforming the material 252 into a holographic optical element (HOE) 250 having stored therein a hologram of the HOE object beam 240 (i.e., the HMS reference beam).

The HOE reference beam 260 may be any suitable beam, but typically is a plane wave or other beam that is easily reproducible. The HOE object beam 240 and the HOE reference beam 260 typically are generated by coherent light from the same or similar laser source, as is known to persons skilled in the art of holography.

Holographic storage material 252 may be any suitable material or configuration or arrangement of materials that is capable of recording either surface or volume holograms or creating diffracted optics. For example, holographic storage material 252 may be a photopolymer, a photoresist, a thermoplastic material, a photorefractive material or a photochromatic material. Holographic storage material 252 has a generally planar first surface 265 and a generally planar, opposing second surface 270. The material 252 is sufficiently planar or reproducible to approximately two wavelengths of light per centimeter.

Referring next to FIG. 3, the generation or formation of a reflection-mode holographic optical element (HOE) 350 for use in a holographic memory system in accordance with the present invention is there depicted. The HOE 350 depicted in FIG. 3 has a different geometry than the transmission-mode HOE 250 depicted in FIG. 2 and discussed hereinabove. More specifically, a HOE reference beam 360 is generated from a source 364 and is directed toward a second surface 370 of holographic storage material 352 to intersect with the HOE object beam 340 at a predetermined location within holographic storage material 352. The resulting interference pattern is captured as a hologram of the HOE object beam 340 within holographic storage material 352, thus forming a HOE 350 of the HOE object beam 340. The reflection-mode HOE 350 differs from the transmission-mode HOE 250 in that, inter alia, the reflection-mode HOE 350 is generated using beams directed at opposing surfaces of the holographic storage material 352 while the transmission-mode HOE 250 is generated using beams directed at the same surface of the holographic storage material 252.

Both transmission-mode and reflection-mode holographic optical elements (HOE) are capable of storing multiple HOE object beams therein via multiplexing. For example, if the holographic storage material is relatively thick, e.g., 1 millimeter, multiple HOE object beams may be multiplexed in the material to form a HOE of multiple object beams. Multiplexing of the multiple object beams may be accomplished by changing the angle, wavelength or position of the HOE reference beam while changing the object beam characteristics. Changes in the object beam characteristics may include the use of a different mask, filter or lens combination, for example.

Figure 4A:
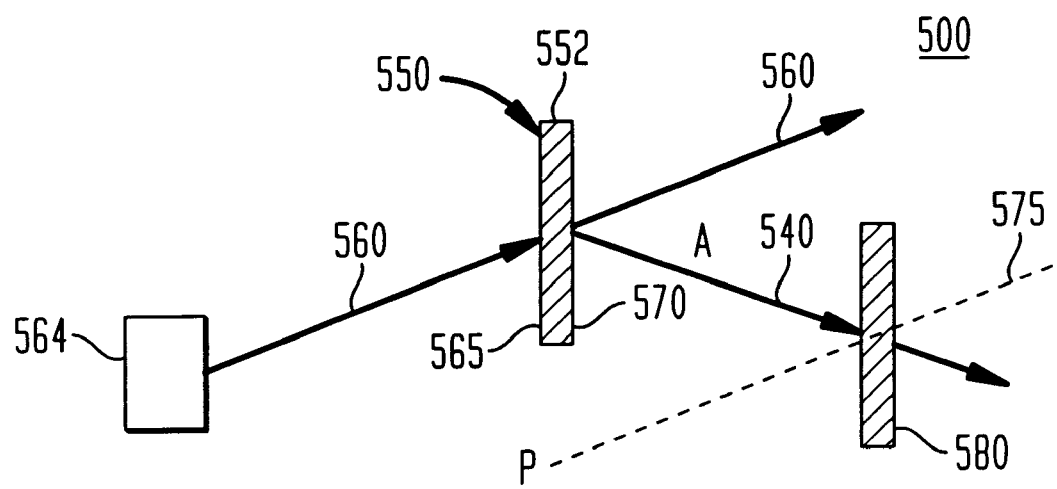
FIGS. 4A–B are schematic diagrams of the use of the holographic optical element of FIG. 2 in a phase correlation multiplexing holographic memory system constructed in accordance with the present invention.
Figure 4B:
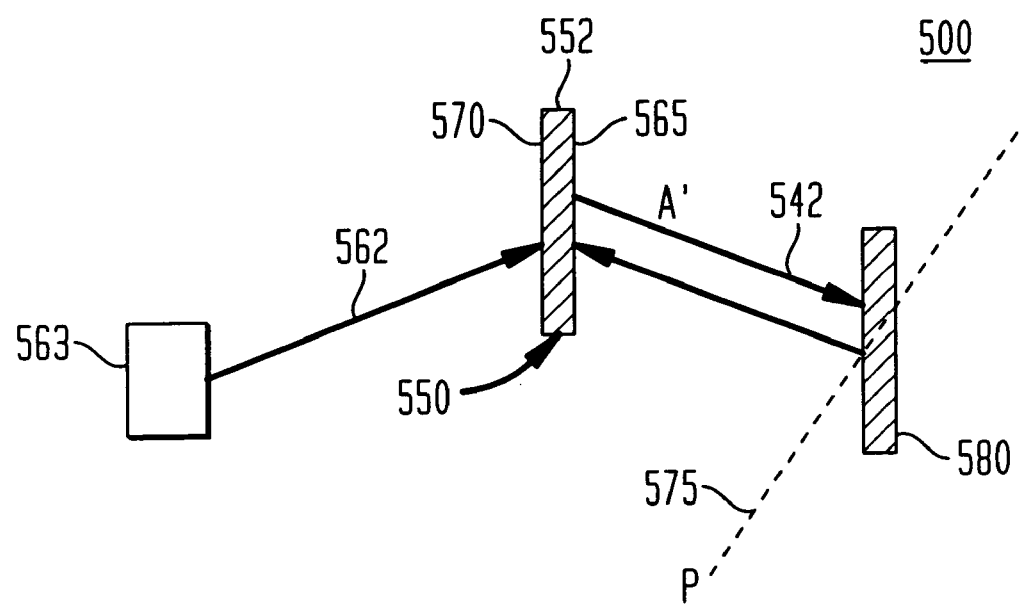

Referring now to FIGS. 4A–B, a transmission-mode holographic optical element (HOE) 550 is shown in use in a holographic memory system (HMS) 500 constructed in accordance with the present invention. To reconstruct the HOE object beam 540 (beam A) from the HOE 550, a reference beam 560 identical or similar to the reference beam used to generate the HOE 550 is generated from a source 564 and is directed toward the HOE 550 to illuminate the HOE 550. The beam emanating from the HOE 550 upon illumination is a reconstruction of the HOE object beam 540 (beam A), which was the object beam originally captured on the holographic storage material 552 to create the HOE 550 and which represent the HMS reference beam. The content and direction of the reference beam 560 with respect to the HOE 550 may depend, at least in part, on the distance D between the second lens 225 within the optical processor 235 (see e.g., FIG. 2) and the holographic storage material 252 compared to the focal length f2 of the second lens during the generation of holographic optical element 550 (e.g., as shown in FIG. 2 and described.

Where the distance D during generation of the HOE 550 is less than the focal length f2 of the second lens (see, e.g., FIG. 2), the image plane 575 (labeled P) of the HOE object beam 540 forms beyond the HOE 550. In such cases, the HOE 550 as depicted in FIG. 4A is illuminated by directing the reference beam 560 toward the same surface (i.e., surface 565) as was used to generate the HOE 550. The HOE object beam 540 is then reconstructed by the interaction of reference beam 560 and HOE 550 to form the image plane 575 (or other plane of interest) of the HOE object beam 540 beyond HOE 550.

Where the distance D during generation of the HOE 550 is greater than the focal length f2 of the second lens (see, e.g., FIG. 2), the image plane 575 (labeled P) of HOE object beam 540 forms before or in front of HOE 550 as depicted in FIG. 4B. In such cases, the complex conjugate of reference beam 562 generated from a source 563, is used to illuminate the HOE 550 from a second surface 570, i.e., from the surface opposite that which as was used to generate HOE 550. The complex conjugate of the HOE object beam 542 (labeled A*) is reconstructed by the interaction of the complex conjugate of reference beam 562 and the HOE 550 to form the plane of interest 575 of the complex conjugate of the HOE object beam 542 before or in front of the HOE 550.

In both embodiments depicted in FIGS. 4A–B, the holographic memory system 500 includes a holographic memory cell (HMC) 580 within which a plurality of holographic data may be stored. The HMC 580 is positioned relative to the image plane 575 for location and retrieval of any of the holographic data stored therein. The holographic data are stored in the HMC 580 as a relatively closely-spaced or densely configured array characterized by a high-degree of selectivity between and among each of the plurality of stored holographic data. For example, a storage density of approximately 300 channel bits/$\mu m^2$ is typical in a PCM holographic system.

Figure 5A:
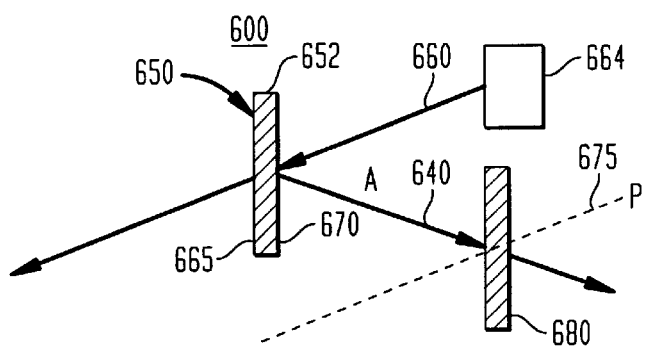
FIGS. 5A–B are schematic diagrams of the use of the holographic optical element of FIG. 3 in a phase correlation multiplexing holographic memory system constructed in accordance with the present invention.
Figure 5B:
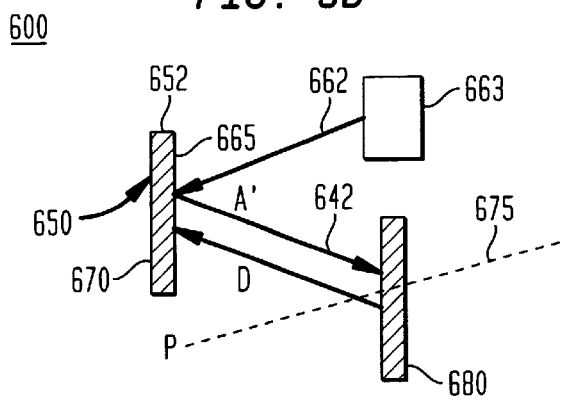

Referring next to FIGS. 5A–B, a reflection-mode holographic optical element (HOE) 650 is depicted as part of a holographic memory system 600 constructed in accordance with the present invention. The HOE object beam 640 (beam A) is reconstructed by directing a reconstruction reference beam 660 from a source 664 toward and illuminating the HOE 650. The content and direction of the reconstruction reference beam 660 with respect to the HOE 650 may depend, at least in part, on the distance D between the second lens 325 of the optical processor 335 (see, e.g., FIG. 3) and holographic storage material 652 as compared to the focal length f2 of the second lens during the generation of the HOE 650.

Where the distance D during generation of the HOE 650 is less than the focal length f2 of the second lens (see, e.g., FIG. 3), the image plane 675 (labeled P) of the HOE object beam 640 forms beyond the HOE 650 as depicted in FIG. 5A. In such cases, the HOE 650 is illuminated by directing the reference beam 660 toward a second surface 670. Then, similar to previous discussions herein, the HOE object beam 640 is reconstructed by the interaction of the reference beam 660 and the HOE 650 to form image plane 675 (of other plane of interest) of the HOE object beam 640 beyond the HOE 650.

Where the distance D during generation of the HOE 650 is greater than the focal length f2 of the second lens (see, e.g., FIG. 3), the image plane 675 (labeled P) of the complex conjugate of the HOE object beam 642 (labeled A*) forms in front of or before holographic optical element (HOE) 650. In such cases, the HOE 650 as depicted in FIG. 5B is illuminated by the complex conjugate of the reference beam 662 generated from a source 663. The complex conjugate of the reference beam 662 illuminates the HOE 650 from a first surface 665 opposite that which was used to generate the HOE 650. The complex conjugate of the HOE object beam 642 (A*) is reconstructed by the interaction of the complex conjugate of the reference beam 662 and the HOE 650 to form an image plane 675 or other plane of interest of the complex conjugate of the HOE object beam 642 before or in front of the HOE 650.

In both embodiments depicted in FIGS. 5A–B, the holographic memory system 600 includes a holographic memory cell (HMC) 680 within which a plurality of holographic data may be stored. The HMC 680 is positioned relative to the image plane 675 for location and retrieval of any of the holographic data stored therein. The holographic data is stored in the HMC 680 as a relatively closely-spaced or densely configured array characterized by a high-degree of selectivity between and among each of the plurality of stored holographic data.

The above description has been directed to a specific embodiment of a device and method for making a holographic optical element (HOE). This discussion is merely illustrative and provided as a non-limiting example of one such device and method. It will be obvious to persons skilled in the art that other devices and methods of making holographic optical elements may be used in connection with the present invention.

Figure 6:
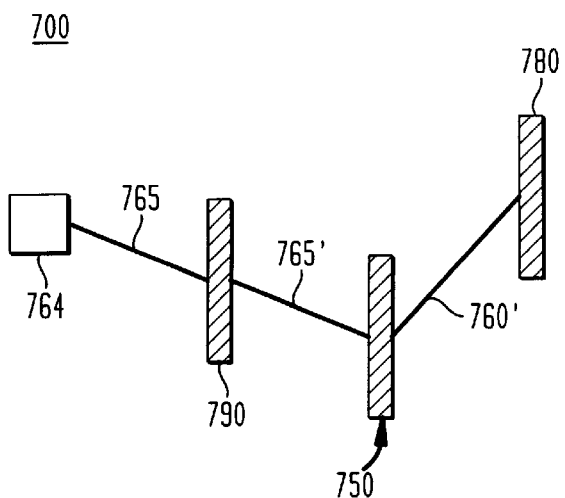
FIG. 6 is a schematic diagram of a holographic memory system constructed in accordance with the present invention.

FIGS. 4A–B and 5A–B generally depict the systems and method for recording or storing holographic data in a holographic storage medium in high-density fashion. Referring next to FIG. 6, the location and retrieval of stored holographic data will now be discussed in detail in accordance with the present invention. A holographic memory system 700 includes an optical processor 735 (see also FIGS. 1–3) through which a plane wave signal 105 passes and from which an encoded object beam 740 emerges. The object beam 740 includes the desired stored holographic data information. The object beam 740 is directed toward a holographic memory cell (HMC) 780 capable of storing a plurality of holographic data, and having a plurality of holographic data stored therein, including the desired holographic data. A plane wave source 764 generates a generally collimated plane wave signal 765 and directs the plane wave signal 765 toward a HOE 750 that includes a hologram of a holographic memory system (HMS) reference beam 760. Before reaching the HOE 750, the plane wave signal 765 is manipulated by a filter 790 so that a manipulated plane wave signal 765' illuminates the HOE 750. The filter 790 may comprise an aperture having a predetermined geometry and having a fixed or variable opening. The aperture geometry may be, by way of non-limiting example, round, oval, rectangular (i.e., a slit), a bull's eye, or of virtually any other size or shape provided that the aperture modifies the plane wave signal 765 so that the manipulated plane wave signal 765' is different (i.e., in diameter) than the plane wave signal 260, 360 (see, e.g., FIGS. 2 and 3) used to create the HOE 750. The filter 790 preferably removes high-frequency components from the plane wave signal 765, effectively bandwidth limiting the signal 765.

The data originally recorded in the HOE 750 is recorded as a Fourier transform. Consequently, there exists a relationship between the frequency spectrum of the reference beam used to created the HOE (i.e., the HOE reference beam), and where the frequency information is spatially recorded in the HOE 750. Therefore, when the HOE 750 is illuminated by a plane wave signal having a different spatial profile than the HOE reference beam, different stored spectral components of the reference will be illuminated and a modified reference beam 760' will be generated by the HOE 750. The modified reference beam 760' will have a different frequency spectrum than the reference beam used to originally record the hologram in the HOE 750, and will actually have a reduced information content due to the elimination of some high-frequency components. In the example, the modified reference beam 760' will have a broader bandwidth selectivity (see, e.g., FIG. 7B) and the same peak maximum as the original reference beam (see, e.g., FIG. 7A).

The present invention provides for quick location and retrieval of any of the plurality of holographic data stored in a holographic memory cell by increasing the width of the selectivity of the holographic memory system. The spatial frequency spectrum of the reference beam is controlled by directing the beam through a filter 790 that obscures a part of the reference beam so as to remove high-frequency components from the reference beam. The filter 790 manipulates the plane wave signal 765 so that the full-width at half-maximum of the modified plane wave signal 765' is significantly increased (see, e.g., FIGS. 7A–B). Thus, the reference beam bandwidth is broadened while the peak position is maintained. Consequently, the scan resolution (spatial sensitivity and step resolution of scans) required to located a particular holographic data is significantly reduced. Holographic data can thus be located and retrieved more quickly, resulting in an improvement in the performance of the holographic memory system.

The geometry (i.e., size and shape) of the aperture of the filter will control the spatial frequency spectrum of the beam directed therethrough. In general, as the area of the aperture decreases, causing the diameter of the beam passing therethrough to also decrease, high-frequency components of the beam are attenuated and/or cut-off. The present invention also contemplates a filter that causes the diameter of a light beam passing therethrough to increase. While a few aperture geometries have been discussed herein, the present invention is not limited to such geometries, which are provided by way of non-limiting, illustrative examples.

Figure 7A:
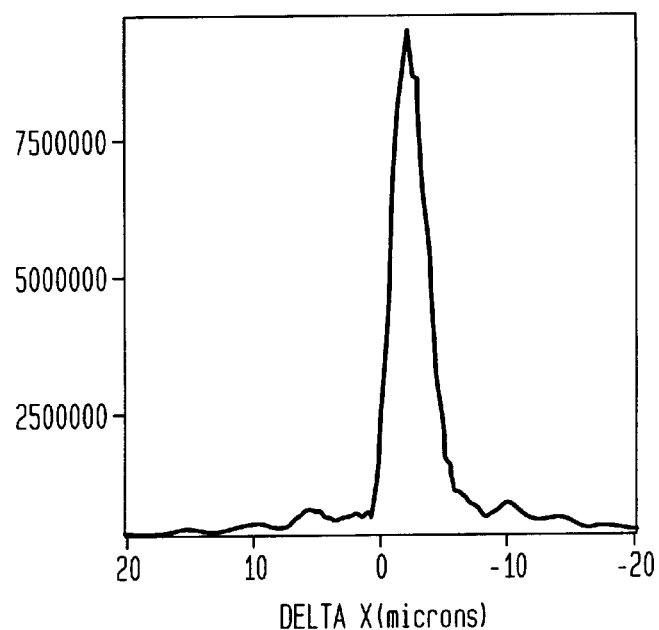
FIG. 7A is a graphical representation of the selectivity function of a prior art holographic memory system.

In general, and as depicted in FIG. 7A, the recording of holograms with a complex reference arm is important to PCM holography and typically results in an extremely narrow selectivity function. Accordingly, extraordinary densities of stored holographic data in a holographic memory cell (e.g., greater than approximately 300 channel bits/$\mu m^2$) are possible with phase correlation multiplexing (PCM) holography. For example, the full width at half maximum of the correlation between the reference beam and the stored holographic data is less than approximately 5 $\mu$m. The peak value in FIG. 7A represents the diffracted intensity of a stored hologram as a function of HMC position.

Figure 7B:
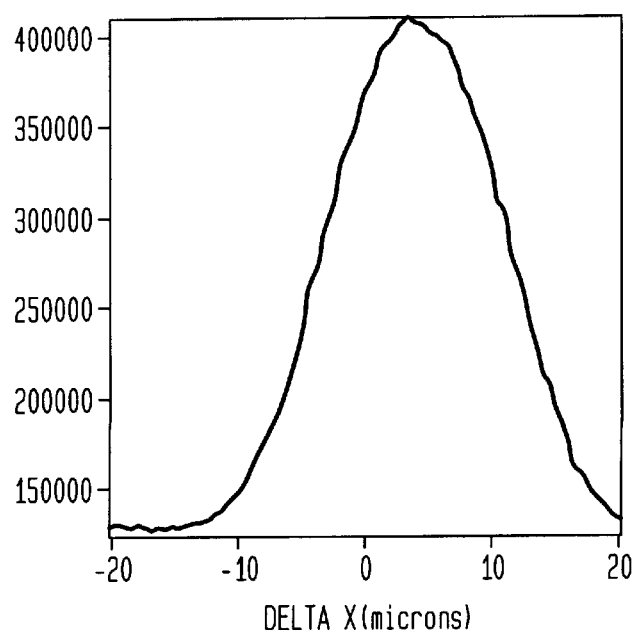
FIG. 7B is a graphical representation of the selectivity function of a holographic memory system constructed in accordance with the present invention.

Retrieval of stored holographic data has heretofore also required a correspondingly narrow selectivity function. Scanning a holographic memory cell densely populated with a plurality of holographic data for a specific holographic data was time consuming and expensive. The present invention advantageously expands or widens the selectively function of the holographic memory system to permit more rapid location and reading of holographic data from a holographic memory cell. The graph depicted in FIG. 7B represents the selectivity function of a holographic memory system configured in accordance with the present invention in which the reference beam has been manipulated by a filter as discussed in detail above. Once the desired stored holographic data is located in the holographic memory cell, the stored data may be reconstructed by removing the filter from the one of the reference beam, i.e., by opening the aperture, for example.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A system for controlling selectivity in a holographic memory system (HMS) for location and retrieval of holographically stored data, said system comprising:
    a holographic memory cell (HMC) having holographic data stored therein;
    a holographic optical element (HOE) having stored therein a hologram of a HMS reference beam having a predetermined bandwidth;
    a plane wave source for generating a plane wave signal and for directing said plane wave signal toward said HOE; and
    a filter, located between said plane wave source and said HOE for filtering said plane wave signal, wherein, upon illumination of said HOE by said filtered plane wave signal, said HOE projects toward said HMC a modified HMS reference beam having a bandwidth modified from said predetermined HMS reference beam bandwidth and being reconstructed from said filtered plane wave signal and said hologram of said HMS reference beam;
    said modified HMS reference beam including low spatial frequency components of the HMS reference beam to provide a reduced scan resolution for locating a desired holographic data previously stored in said HMC using the HMS reference beam.

2. The system of claim 1, wherein said filter obscures a part of said plane wave signal.

3. The system of claim 2, wherein said plane wave signal has a predetermined spatial frequency spectrum and wherein said filter removes a high spatial frequency component of said plane wave signal.

4. The system of claim 2, wherein said filter comprises a fixed area aperture through which said plane wave signal is directed.

5. The system of claim 2, wherein said filter comprises a variable area aperture through which said plane wave signal is directed.

6. The system of claim 1, wherein said HOE is a transmission-mode HOE.

7. The system of claim 1, wherein said HOE is a reflection-mode HOE.

8. A method of controlling the selectivity of a holographic memory system (HMS) including a holographic memory cell (HMC) having holographic data stored therein, a holographic optical element (HOE) having a hologram of a HMS reference beam having a predetermined bandwidth stored therein, a plane wave source for generating a plane wave signal and for directing the plane wave signal toward the HOE, a filter, located between the plane wave source and HOE, said method comprising the step of filtering the plane wave signal so that upon illumination of the HOE by the filtered plane wave signal, the HOE projects toward the HMC a modified HMS reference beam having a bandwidth modified from the predetermined HMS reference beam bandwidth and being reconstructed from the filtered plane wave signal and the hologram of the HMS reference beam;
    wherein the modified HMS reference beam includes low spatial frequency components of the HMS reference beam and provides a reduced scan resolution for locating a desired holographic data previously stored in the HMC using the HMS reference beam.

9. The method of claim 8, wherein said method comprises the step of obscuring a part of the plane wave signal.

10. The method of claim 8, wherein the plane wave signal has a predetermined spatial frequency spectrum and wherein said method further comprises the step of removing a high spatial frequency component of the plane wave signal.

11. The method of claim 8, wherein said method further comprises the step of directing the plane wave signal through a fixed area aperture.

12. The method of claim 8, wherein said method further comprises the step of directing the plane wave signal through a variable area aperture.

13. A system for controlling selectivity in a holographic memory system (HMS) for location and retrieval of holographic data stored in a holographic storage material, said system comprising:
    a holographic optical element (HOE) having stored therein a hologram of a reference beam having a predetermined bandwidth;
    a light source for generating a generally collimated light signal and for directing said light signal toward said HOE; and
    a filter, located between said light source and said HOE, for filtering said light signal, wherein, upon illumination of said HOE by said filtered light signal, said HOE projects toward the holographic storage material a modified reference beam having a bandwidth modified from said predetermined reference beam bandwidth and being reconstructed from said light signal and said hologram of said reference beam, said modified reference beam including low spatial frequency components of the HMS reference beam to provide a reduced scan resolution for locating a desired holographic data previously stored in the holographic data storage material using the HMS reference beam.

14. The system of claim 13, wherein said filter obscures a part of said light signal.

15. The system of claim 14, wherein said light signal has a predetermined spatial frequency spectrum and wherein said filter removes a high spatial frequency component of said light signal.

16. The system of claim 14, wherein said filter comprises a fixed area aperture through which said light signal is directed.

17. The system of claim 14, wherein said filter comprises a variable area aperture through which said light signal is directed.

18. The system of claim 13, wherein said HOE is a transmission-mode HOE.

19. The system of claim 13, wherein said HOE is a reflection-mode HOE.

* * * * *